(12) United States Patent
Jun et al.

(10) Patent No.: US 7,679,085 B2
(45) Date of Patent: Mar. 16, 2010

(54) DISPLAY DEVICE, METHOD FOR FABRICATING THIN FILM TRANSISTOR AND METHOD FOR FABRICATING THIN FILM TRANSISTOR ARRAY SUBSTRATE USING THE SAID METHOD

(75) Inventors: Woong Gi Jun, Anyang-si (KR); Gee Sung Chae, Incheon-si (KR); Jae Seok Heo, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 429 days.

(21) Appl. No.: 11/646,241

(22) Filed: Dec. 28, 2006

(65) Prior Publication Data

US 2008/0001151 A1    Jan. 3, 2008

(30) Foreign Application Priority Data

Jun. 30, 2006    (KR) ............... 10-2006-0061432

(51) Int. Cl.
*H01L 29/04* (2006.01)
*H01L 35/24* (2006.01)

(52) U.S. Cl. ............... 257/59; 257/72; 257/40; 257/410; 257/411

(58) Field of Classification Search ............... 257/40, 257/411, 410, 59, 72
See application file for complete search history.

(56) References Cited

U.S. PATENT DOCUMENTS

| 6,410,960 | B1 * | 6/2002 | Arai et al. ............... 257/347 |
| 2004/0012018 | A1 * | 1/2004 | Tanabe ............... 257/40 |
| 2004/0188682 | A1 | 9/2004 | Hirai |
| 2005/0274954 | A1 | 12/2005 | Tanaka et al. |
| 2005/0285102 | A1 | 12/2005 | Koo et al. |
| 2006/0138404 | A1 * | 6/2006 | Okada et al. ............... 257/40 |
| 2006/0273316 | A1 * | 12/2006 | Yang et al. ............... 257/59 |
| 2007/0235719 | A1 * | 10/2007 | Ong et al. ............... 257/40 |

* cited by examiner

*Primary Examiner*—Kenneth A Parker
*Assistant Examiner*—Joseph Nguyen
(74) *Attorney, Agent, or Firm*—McKenna Long & Aldridge LLP

(57) ABSTRACT

A method for fabricating a thin film transistor (TFT) on a substrate includes forming a gate electrode; forming a semiconductor layer being insulated from the gate electrode and partially overlapped with the gate electrode; sequentially forming first and second gate insulating layers between the gate electrode and the semiconductor layer, wherein the first gate insulating layer is formed of a material different from the second gate insulating layer and at least one of the first and second gate insulating layers includes a sol-compound; and forming source and drain electrodes at both sides of the semiconductor layer.

25 Claims, 2 Drawing Sheets

DISPLAY DEVICE, METHOD FOR FABRICATING THIN FILM TRANSISTOR AND METHOD FOR FABRICATING THIN FILM TRANSISTOR ARRAY SUBSTRATE USING THE SAID METHOD

This application claims the benefit of the Korean Patent Application No. 10-2006-61432, filed on Jun. 30, 2006, which is hereby incorporated by reference as if fully set forth herein.

BACKGROUND OF THE INVENTION

1. Field of the Invention

The present invention relates to a display device including a liquid crystal display (LCD) device, and more particularly, to a thin film transistor array substrate and method for fabricating the same.

2. Discussion of the Related Art

Recently, LCD devices have received much attention as flat panel display devices. The LCD devices have been actively studied owing to their high contrast ratio, suitability for displaying gray levels or moving pictures, and low power consumption.

Particularly, since LCD devices can be fabricated with a thin thickness, they can be used as a ultra slim display device such as wall-mountable TVs. Also, since LCD devices are lightweight and have a lower power consumption than CRTs, they are used as displays for notebook computers operating with batteries, personal portable terminals, TVs, and monitors for spacecrafts. In this way, LCD devices have received much attention as a display device for the next generation.

Generally, an LCD device includes a TFT array substrate provided with a TFT, a pixel electrode, and a storage capacitor in each pixel region defined by gate and data lines, a color filter array substrate provided with a color filter layer and a common electrode, and a liquid crystal layer interposed between the two substrates. The LCD device displays a picture image by applying a voltage to the electrodes to rearrange the liquid crystal molecules of the liquid crystal layer and controlling the light transmittance.

In such an LCD device, the TFT is used as a switching device for displaying images.

The TFT is formed at a crossing portion between the gate and data lines in a unit pixel region, and serves to switch a current with respect to the unit pixel region. During the on-state of the TFT, the current flows to charge a capacitor connected to a specific unit pixel region at a desired voltage. During the off-state, the charged state is maintained until the next period that the unit pixel region is addressed.

A voltage level determines a gray level that represents an amount of light transmitted through a liquid crystal layer corresponding to the unit pixel region.

The aforementioned TFT has two types of structures, i.e., a coplanar type TFT of which source and gate electrodes are arranged on one plane, and a staggered type TFT of which source and gate electrodes are arranged on different planes. In general, a polycrystalline silicon TFT employs the coplanar type TFT while an amorphous silicon TFT employs the staggered type TFT.

The staggered type TFT is divided into an inverted staggered type TFT and a normal staggered type TFT, wherein the inverted staggered type TFT includes a gate electrode arranged below source and drain electrodes, and the normal staggered type TFT includes a gate electrode arranged above source and drain electrodes. The inverted staggered type TFT is referred to as a bottom-gate type TFT, and the normal staggered type TFT is referred to as a top-gate type TFT.

Generally, the LCD device is provided with a bottom-gate type TFT. The bottom-gate type TFT includes a gate electrode, a gate insulating layer provided on an entire surface including the gate electrode, a semiconductor (a-Si) layer formed on the gate insulating layer on the gate electrode, an ohmic contact layer (n+a-Si) provided in other regions except a channel region of the semiconductor layer, and source and drain electrodes formed on the ohmic contact layer.

The gate insulating layer is formed in such a manner that an inorganic material such as silicon nitride (SiNx) or silicon oxide (SiOx) having a dielectric constant of about 7.5 is deposited by a plasma enhanced chemical vapor deposition (PECVD) process.

However, when the gate insulating layer is formed by depositing such an inorganic material, the following problems may occur.

In other words, when the gate insulating layer is formed of such an inorganic material, it is difficult for the gate insulating layer to have a uniform thickness with a single deposition process. Accordingly, the deposition process should be performed twice. This complicates the fabrication process and increases the production costs.

To solve the above problem, a method for forming a gate insulating layer of an organic material having a dielectric constant of 3 to 4 has been suggested. By this method, the gate insulating layer can be formed by a simple process with inexpensive equipment.

Unlike the inorganic gate insulating layer, because the organic gate insulating layer is formed by a coating process, such as a spin coating or slit coating, not the PECVD process, the process steps are simplified and the production cost is reduced. Also, the steps of the gate line and the gate electrode is planarized by a uniform thickness of such an organic gate insulating layer.

However, because the organic gate insulating layer has a smaller dielectric constant than that of the inorganic gate insulating layer, when the organic and inorganic gate insulating layers have the same thickness, a parasitic capacitance (Cgs) value formed between a gate line layer and a data line layer becomes small. This is because an insulating layer formed between opposing electrodes has a capacitance value proportional to its dielectric constant and thickness, but inversely proportional to areas of the opposing electrodes.

If the parasitic capacitance (Cgs) value becomes small, voltage drop ΔVp increases as expressed by the following equation 1. Such a small parasitic capacitance (Cgs) value causes undesired effects such as a flicker, image sticking or uneven screen brightness.

$$\Delta Vp = \frac{Cgs}{Cgs + Cst + Clc} \Delta Vg \qquad \text{[Equation 1]}$$

In this case, Cgs is parasitic capacitance formed between the gate electrode and the source and drain electrodes, Clc is capacitance accumulated in a liquid crystal cell, and Cst is capacitance formed in a storage capacitor. ΔVp is a differential voltage between a data voltage Vd applied to the source electrode and a voltage Vlc charged in the liquid crystal cell, and ΔVg is a differential voltage between a gate voltage Vgh of a high level and a gate voltage Vgl of a low level.

In other words, the parasitic capacitance Cgs greatly affects ΔVp as expressed by the equation 1, and is closely related to panel characteristics and picture quality characteristics. To lower ΔVp, the parasitic capacitance Cgs value should be increased. To increase the parasitic capacitance Cgs value, the dielectric constant of the gate insulating layer should be increased. Accordingly, the gate insulating layer should have a high dielectric constant.

As described above, the aforementioned related art method for fabricating the TFT array substrate has the following problems.

When an inorganic insulating layer of silicon nitride or silicon oxide is used for the gate insulating layer, the fabrication process becomes complicated and the production costs increase. Also, when an organic insulating layer such as PVA (polyvinyl alcohol) and PVP (polyvinyl phenol) is used for the gate insulating layer, ΔVp value increases due to the low dielectric constant of the organic insulating layer and the coating thickness of the gate insulating layer becomes uneven.

SUMMARY OF THE INVENTION

Accordingly, the present invention is directed to a thin film transistor array substrate and method for fabricating the same, which substantially obviates one or more problems due to limitations and disadvantages of the related art.

An advantage of the present invention is to provide a thin film transistor array substrate and method for fabricating the same that can improve the characteristics of thin film transistors.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, a method for fabricating a thin film transistor (TFT) on a substrate includes forming a gate electrode; forming a semiconductor layer being insulated from the gate electrode and partially overlapped with the gate electrode; sequentially forming first and second gate insulating layers between the gate electrode and the semiconductor layer, wherein the first gate insulating layer is formed of a material different from the second gate insulating layer and at least one of the first and second gate insulating layers includes a sol-compound; and forming source and drain electrodes at both sides of the semiconductor layer.

The first gate insulating layer of a sol-gel type and the second gate insulating layer of an inorganic insulating material or organic polymer are sequentially deposited so as to form a dual-layer gate insulating layer.

In another aspect of the present invention, a display device includes a display panel; a gate driver applying scanning signals to a plurality of gate lines and a data driver applying video signals to a plurality of data lines in the display panel, the gate and data lines defining a plurality of pixels; and a thin film transistor in each pixel, the thin film transistor including a gate electrode, a gate insulating layer, a semiconductor layer, and source/drain electrodes, the gate insulating layer further having a first gate insulating layer and a second gate insulating layer, the second insulating layer including a material different from the first gate insulating layer, wherein at least one of the first and second gate insulating layers includes an organic/inorganic hybrid material.

In yet another aspect of the present invention, a thin film transistor (TFT) on a substrate includes a gate electrode; a semiconductor layer insulated from the gate electrode and partially overlapped with the gate electrode; first and second gate insulating layers between the gate electrode and the semiconductor layer, wherein the first gate insulating layer is formed of a material different from the second gate insulating layer and at least one of the first and second gate insulating layers includes a sol-compound; and source and drain electrodes at both sides of the semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Hereinafter, a method for fabricating a thin film transistor and a method for fabricating a TFT array substrate according to the present invention will be explained with reference to the accompanying drawings.

Figure 1:
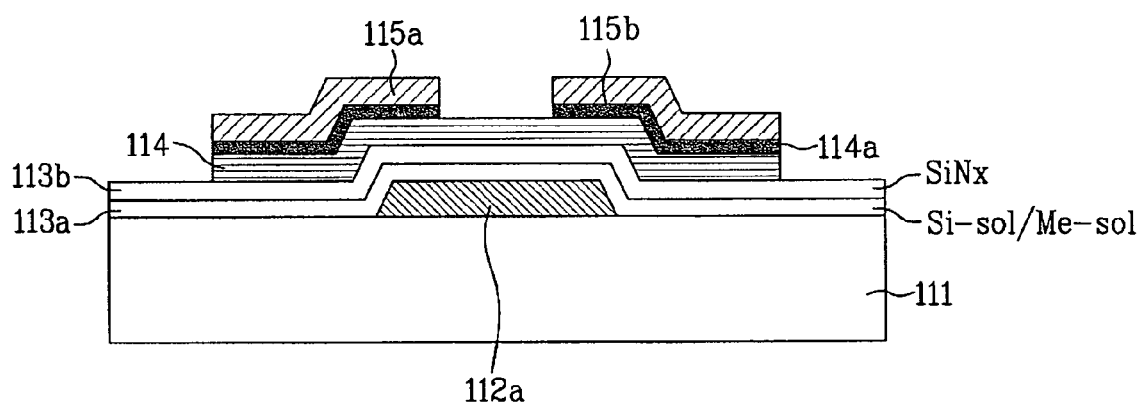
FIG. 1 is a cross-sectional view of a bottom-gate type thin film transistor according to the present invention.
Figure 2:
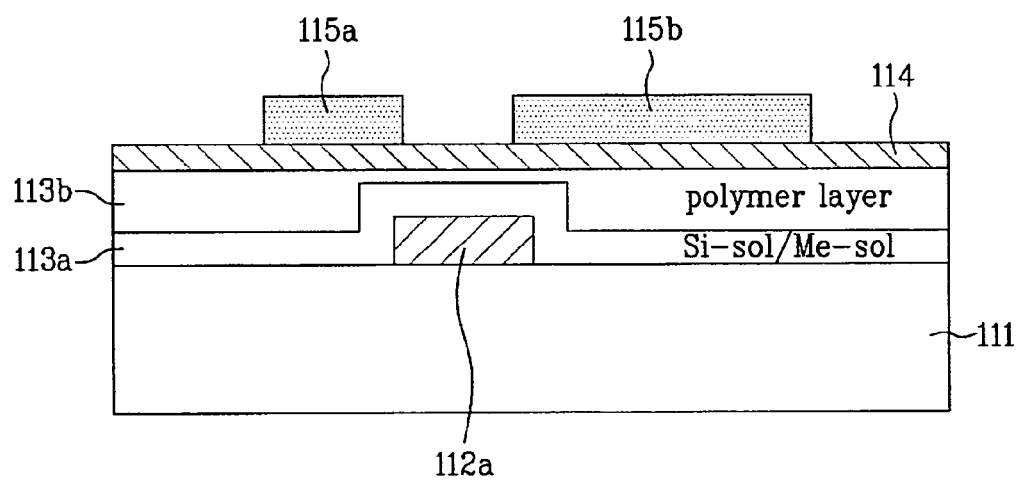
FIG. 2 is a cross-sectional view of a bottom-gate type organic thin film transistor according to the present invention.
Figure 3:
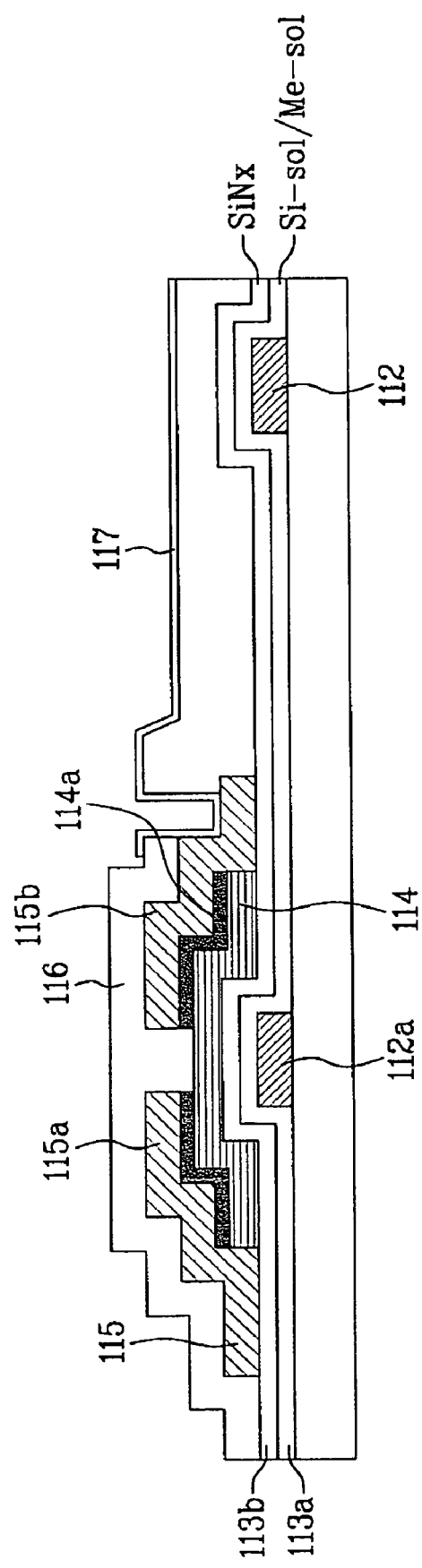
FIG. 3 is a cross-sectional view of a TFT array substrate according to the present invention.

FIG. 1 is a cross-sectional view of a bottom-gate type thin film transistor according to the present invention. FIG. 2 is a cross-sectional view of a bottom-gate type organic thin film transistor according to the present invention. FIG. 3 is a cross-sectional view of a TFT array substrate according to the present invention.

Method for Fabricating Thin Film Transistor

Referring to FIG. 1, a low-resistance metal, for example, copper Cu, aluminum Al, aluminum neodymium AlNd, molybdenum Mo, chrome Cr, titanium Ti, tantalum Ta, molybdenum-tungsten MoW, or the like is first deposited on a substrate 111 by a sputtering method, and is patterned by a photolithography process to thereby form a gate electrode 112a.

A first gate insulating layer 113a is then formed on an entire surface of the substrate 111 including the gate electrode 112a, wherein the first gate insulating layer 113a is formed of a compound (Si-sol/Me-sol) including a sol-compound of silicon alkoxide and metal alkoxide. Alkoxide is a compound wherein metal atoms substitute for hydrogen atoms of hydroxyl group of alcohol.

In more detail, silicon alkoxide reacts on metal alkoxide in a sol-type, thereby forming a sol-gel compound. The sol-gel compound is an organic/inorganic hybrid type material. Also, the dielectric constant and transmittance of the sol-gel compound change according to a content ratio of silicon alkoxide and metal alkoxide. For example, when mixing silicon alkoxide and metal alkoxide at a ratio of 1 to 1, the sol-gel compound has a high dielectric constant and great transmittance. Because this organic/inorganic compound material has a great insulating efficiency, good heat-resistance, high hardness and great transmittance, and is also easy to control the dielectric constant, the sol-gel compound is suitable for the gate insulating layer of the thin film transistor.

The metal particles of metal alkoxide are formed of at least any one of titanium Ti, zirconium Zr, yttrium Y, aluminum Al, hafnium Hf, calcium Ca and magnesium Mg. In this case, the dielectric constant for the metal particles of metal alkoxide is above 7 so that it is suitable for the gate insulating layer of a high dielectric constant.

The sol-compound of silicon alkoxide and metal alkoxide is formed by a hydrolysis and condensation reaction. In this case, water or alcohol may be used as a catalyst for acceleration of the reaction.

The organic/inorganic compound material may be formed by any one of printing, coating and deposition processes, so that it is possible to simplify the process and to obtain a good flatness.

After forming the first gate insulating layer 113a of the sol-gel compound, an inorganic insulating material, for example, silicon oxide SiOx or silicon nitride SiNx, is formed on the entire surface of the substrate including the first gate insulating layer 113a by a PECVD (plasma enhanced chemical vapor deposition) method to form a second gate insulating layer 113b.

Since the second gate insulating layer 113b of the inorganic insulating layer has a dielectric constant of about 7 and the first gate insulating layer 113a of the sol-gel compound has a high dielectric constant, the entire gate insulating layer has a high dielectric constant. As described above, the first gate insulating layer 113a has a high dielectric constant owing to metal alkoxide having a dielectric constant of 7 or more.

By enhancing the dielectric property of the gate insulating layer, a storage capacitance (Cst) is increased in value. Accordingly, it is possible to overcome a problem of voltage drop ($\Delta Vp$) in the thin film transistor shown in the above equation 1, thereby improving display quality. And, the first and second gate insulating layers 113a and 113b may be formed by any one of printing, coating and deposition processes and one PECVD process so that it is possible to simplify the process in comparison with the previous two or more PECVD process.

With the gate insulating layer including the first gate insulating layer 113a (Si-sol/Me-sol) having a high dielectric constant of 7 or more and the second gate insulating layer 113b of an inorganic material, a mobility of the thin film transistor is also increased to 1.0 or above from 0.4.

After forming the first and second gate insulating layers 113a and 113b, an amorphous silicon (a-Si) layer is formed with a thickness of 500 Å or less on the entire surface of the substrate at a high temperature to form a semiconductor layer 114. Amorphous silicon (a-Si) doped with n-type impurity ions is then formed with a thickness of about 300 Å to 700 Å at a high temperature to form an ohmic contact layer 114a of $n^+$a-Si. These deposition processes of a-Si and $n^+$a-Si are sequentially performed in the same chamber. However, these deposition processes may be performed in separate chambers.

Then, a low-resistance metal, for example, copper Cu, aluminum Al, aluminum neodymium AlNd, molybdenum Mo, chrome Cr, titanium Ti, tantalum Ta, molybdenum-tungsten MoW, or the like is deposited on the entire surface of the substrate including the ohmic contact layer 114a by a sputtering method, and is then patterned by a photolithography process to form source and drain electrodes 115a and 115b at both sides of the semiconductor layer 114.

Thus, it is possible to complete the thin film transistor that includes the gate electrode 112a, the gate insulating layer 113, the semiconductor layer 114, the ohmic contact layer 114a, and the source and drain electrodes 115a and 115b.

The thin film transistor described above is a bottom-gate type thin film transistor wherein the gate electrode is positioned under the source and drain electrodes. However, it should be understood that the principles of the present invention is applicable to other types of thin film transistors including a top-gate type thin film transistor.

In case of the top-gate type thin film transistor, source and drain electrodes are formed on a substrate. Then, a semiconductor layer is overlapped with the source and drain electrodes in-between. After that, a first gate insulating layer (Si-sol/Me-sol) having a high dielectric constant of 7 or more and a second gate insulating layer of an inorganic material such as SiNx are sequentially formed on an entire surface of the substrate including the semiconductor layer. Then, a gate electrode is formed on the gate insulating layer above the semiconductor layer.

To form the source and drain electrodes and the gate electrode, a low-resistance metal, for example, copper Cu, aluminum Al, aluminum neodymium AlNd, molybdenum Mo, chrome Cr, titanium Ti, tantalum Ta, molybdenum-tungsten MoW, or the like is deposited on the substrate by a sputtering method, and is then patterned by a photolithography process. To form the semiconductor layer, amorphous silicon is deposited at a high temperature and is then patterned.

To form the first gate insulating layer, silicon alkoxide reacts on metal alkoxide in a sol-type, and the sol-gel compound material is formed by any one of printing, coating and deposition processes. Also, the second gate insulating layer is formed by depositing an inorganic insulating material such as silicon oxide SiOx or silicon nitride SiNx by a PECVD method.

Method for Fabricating Organic Thin Film Transistor

A method for fabricating an organic thin film transistor according to the present invention is similar to the above-mentioned method for fabricating the thin film transistor according to the present invention. Accordingly, the same reference numbers will be used throughout the drawings to refer to the same or like parts.

Referring to FIG. 2, $n^+$a-Si, ITO and Al are first deposited on a substrate, and are patterned by a photolithograph process to thereby form a gate electrode 112a. Instead of using the above layers, the gate electrode 112a may be formed of a conductive organic polymer material such as PEDOT (polyethylene-dioxythiophene) by a coating or inject-printing method.

A compound material (Si-sol/Me-sol) including a sol-compound of silicon alkoxide and metal alkoxide is then formed on an entire surface of the substrate including the gate electrode 112a.

In more detail, silicon alkoxide reacts on metal alkoxide in a sol-type, thereby forming a sol-gel compound. The sol-gel compound is an organic/inorganic hybrid type material. Also, the dielectric constant and transmittance of the sol-gel compound change according to a content ratio of silicon alkoxide and metal alkoxide. For example, when mixing silicon alkoxide and metal alkoxide at a ratio of 1 to 1, the sol-gel compound has a high dielectric constant and great transmittance. Because this organic/inorganic compound material has a great insulating efficiency, good heat-resistance, high hardness, and great transmittance, and is also easy to control the dielectric constant, the sol-gel compound is suitable for the gate insulating layer of the thin film transistor.

The metal particles of metal alkoxide are formed of at least any one of titanium Ti, zirconium Zr, yttrium Y, aluminum Al, hafnium Hf, calcium Ca and magnesium Mg. In this case, the dielectric constant for the metal particles of metal alkoxide is above 7 so that it is suitable for the gate insulating layer of a high dielectric constant.

The sol-compound of silicon alkoxide and metal alkoxide is formed by a hydrolysis and condensation reaction. In this case, water or alcohol may be used as a catalyst for acceleration of the reaction.

After forming the first gate insulating layer 113a of the organic/inorganic compound material, an organic polymer layer such as PVA (polyvinyl alcohol), PVAc (polyvinyl acetate), PVP (polyvinyl phenol), PMMA (polyvinyl methyl methacrylate), or the like is formed on the entire surface of the substrate including the first gate insulating layer 113a to form a second gate insulating layer 113b.

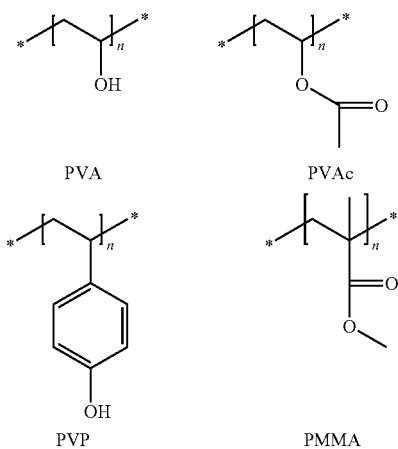

The first and second gate insulating layers 113a and 113b may be formed by any one of printing, coating and deposition processes so that it is possible to simplify the process and to obtain a good flatness.

Even though the second gate insulating layer 113b of an organic material has a slightly low dielectric property, the entire gate insulating layer has a high dielectric constant owing to the high dielectric constant of the first gate insulating layer 113a. As described above, the first gate insulating layer 113a has a high dielectric constant owing to metal alkoxide having a dielectric constant of 7 or more.

By enhancing the dielectric property of the gate insulating layer, a storage capacitance (Cst) is increased in value. Accordingly, it is possible to overcome a problem of voltage drop ($\Delta Vp$) in the thin film transistor shown in the above equation 1, thereby improving display quality.

After forming the first and second gate insulating layers 113a and 113b, an organic semiconductor layer 114 is formed on the gate insulating layer 113 above the gate electrode 112a, wherein the organic semiconductor layer 114 is formed of a pentacene-based or thiophene-based low molecular material or polythiophene-based high molecular material.

Then, a metal material of argentums Au, aluminum Al, nickel Ni, or the like is formed on the entire surface of the substrate including the organic semiconductor layer 114 by a sputtering method, and is then patterned by a photolithography process to form source and drain electrodes 115a and 115b at both sides of the semiconductor layer 114.

Thus, it is possible to complete the organic thin film transistor that includes the gate electrode 112a, the gate insulating layer 113, the organic semiconductor layer 114, and the source and drain electrodes 115a and 115b.

In the above, the organic thin film transistor is formed in a bottom-gate type wherein the gate electrode is positioned under the source and drain electrodes. However, it should be understood that the principles of the present invention is applicable to other types of thin film transistors including a top-gate type thin film transistor.

Also, it is possible to fabricate the above organic thin film transistor with a low-temperature process. Thus, a flexible plastic substrate or film may be used for the substrate of the thin film transistor. And, the interface property between the organic semiconductor layer and the gate insulating layer is improved so that a mobility of the thin film transistor may be increased.

Method for Fabricating TFT Array Substrate

A method for fabricating a TFT array substrate according to the present invention is similar to the above-mentioned method for fabricating the thin film transistor according to the present invention. Accordingly, the same reference numbers will be used throughout the drawings to refer to the same or like parts.

Still referring to FIG. 3, a low-resistance metal, for example, copper Cu, aluminum Al, aluminum neodymium AlNd, molybdenum Mo, chrome Cr, titanium Ti, tantalum Ta, molybdenum-tungsten MoW, or the like is first deposited on a substrate by a sputtering method, and is patterned by a photolithography process to form a gate line 112 and a gate electrode 112a.

Then, a first gate insulating layer 113a is formed on an entire surface of the substrate including the gate electrode 112a, wherein the first gate insulating layer 113a is formed of a compound (Si-sol/Me-sol) including a sol-compound of silicon alkoxide and metal alkoxide.

In more detail, silicon alkoxide reacts on metal alkoxide in a sol-type, thereby forming a sol-gel compound. The sol-gel compound is an organic/inorganic hybrid type material. Also, the dielectric constant and transmittance of the sol-gel compound change according to a content ratio of silicon alkoxide and metal alkoxide. For example, when mixing silicon alkoxide and metal alkoxide at a ratio of 1 to 1, the sol-gel compound has a high dielectric constant and great transmittance. Because this organic/inorganic compound material has a great insulating efficiency, good heat-resistance, high hardness, and great transmittance, and is also easy to control the dielectric constant, the sol-gel compound is suitable for the gate insulating layer of the thin film transistor.

The metal particles of metal alkoxide are formed of at least any one of titanium Ti, zirconium Zr, yttrium Y, aluminum Al, hafnium Hf, calcium Ca and magnesium Mg. In this case, the dielectric constant for the metal particles of metal alkoxide is above 7 so that it is suitable for the gate insulating layer of a high dielectric constant.

The sol-compound of silicon alkoxide and metal alkoxide is formed by a hydrolysis and condensation reaction. In this case, water or alcohol may be used as a catalyst for acceleration of the reaction.

The organic/inorganic compound material may be formed by any one of printing, coating and deposition processes, so that it is possible to simplify the process and to obtain a good flatness.

After forming the first gate insulating layer 113a of the sol-gel compound, an inorganic insulating material, for example, silicon oxide SiOx or silicon nitride SiNx, is formed on the entire surface of the substrate including the first gate insulating layer 113a by a PECVD (plasma enhanced chemical vapor deposition) method to form a second gate insulating layer 113b.

Since the second gate insulating layer 113b has a dielectric constant of about 7 and the first gate insulating layer 113a of the sol-gel compound has a high dielectric constant, the entire gate insulating layer has a high dielectric constant. As described above, the first gate insulating layer 113a has a high dielectric constant owing to metal alkoxide having a dielectric constant of 7 or more.

By enhancing the dielectric property of the gate insulating layer, a storage capacitance (Cst) is increased in value. Accordingly, it is possible to overcome a problem of voltage drop ($\Delta Vp$) in the thin film transistor shown in the above equation 1, thereby improving display quality. And, the first and second gate insulating layers 113a and 113b may be formed by any one of printing, coating and deposition processes and one PECVD process so that it is possible to simplify the process in comparison with the previous two or more PECVD process.

With the gate insulating layer including the first gate insulating layer 113a (Si-sol/Me-sol) having a high dielectric constant of 7 or more and the second gate insulating layer 113b of an inorganic material, a mobility of the thin film transistor is also increased to 1.0 or above from 0.4.

After forming the first and second gate insulating layers 113a and 113b, an amorphous silicon (a-Si) layer is formed and patterned on the entire surface of the substrate, to thereby form a semiconductor layer 114. Amorphous silicon a-Si doped with n-type impurity ions is then deposited, and is patterned to form an ohmic contact layer 114a of $n^+$a-Si.

Then, a low-resistance metal, for example, copper Cu, aluminum Al, aluminum neodymium AlNd, molybdenum Mo, chrome Cr, titanium Ti, tantalum Ta, molybdenum-tungsten MoW, or the like is deposited on the entire surface of the substrate including the ohmic contact layer 114a by a sputtering method, and is then patterned by a photolithography process to form source and drain electrodes 115a and 115b at both sides of the semiconductor layer 114 and form a data line 115 connected with the source electrode 115a.

The gate line is formed in perpendicular to the data line to define a unit pixel. The thin film transistor that includes the gate electrode 112a, the gate insulating layer 113, the semiconductor layer 114, the ohmic contact layer 114a, and the source and drain electrodes 115a and 115b is formed adjacent to a crossing of the gate and data lines. The above thin film transistor may be formed in a top-gate type thin film transistor or a top-gate type organic thin film transistor.

Then, a passivation layer 116 is formed on the entire surface of the substrate including the thin film transistor. In this case, the passivation layer may be formed by coating an organic material such as BCB (Benzocyclobutene) or acrylic-based material, or by depositing an inorganic material such as SiNx or SiOx.

The passivation layer 116 is then selectively removed so as to expose some of the drain electrode 115b, thereby forming a contact hole. Then, a transparent conductive material of ITO (indium-tin-oxide) or IZO (indium-zinc-oxide) is deposited on the entire surface of the passivation layer 116 including the contact hole, and is patterned to form a pixel electrode 117 that is electrically in contact with the drain electrode 115b through the contact hole.

Although not shown, the above TFT array substrate is then attached to another substrate, with a liquid crystal layer therebetween. The opposite substrate includes a black matrix layer that prevents light leakage; a color filter layer including R, G, and B color resists arranged regularly; an overcoat layer that protects the color filter layer and obtains a flatness in the entire surface; and a common electrode that forms an electric field with the pixel electrode 117 of the TFT array substrate.

As mentioned above, the method for fabricating the TFT array substrate according to the present invention has the following advantages.

In the method for fabricating the TFT array substrate according to the present invention, the first gate insulating layer of sol-gel type and the second gate insulating layer of an inorganic material or organic polymer are sequentially deposited so that the gate insulating layer has a dual-layer structure. Accordingly, it is possible for the gate insulating layer to have a high dielectric constant.

By enhancing the dielectric property of the gate insulating layer, the storage capacitance (Cst) is increased in value. Accordingly, it is possible to overcome a problem of voltage drop ($\Delta Vp$) in the thin film transistor shown in the above equation 1, thereby improving display quality.

Also, it is possible to control insulating efficiency, heat-resistance, hardness, and transmittance in the organic/inorganic compound material according to the content ratio of silicon alkoxide and metal alkoxide. Thus, the organic/inorganic compound material is suitable for the gate insulating layer of the thin film transistor, or the gate insulating layer of the LCD device.

The related art method for fabricating the gate insulating layer requires at least two deposition processes. In the present invention, the gate insulating layer may be formed by printing, coating or depositing the sol-gel compound material and by depositing the inorganic insulating material. Thus, any one of printing, coating and deposition processes is able to substitute for one deposition process. Accordingly, a method for fabricating a gate insulating layer according to the present invention is more simplified.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
 a display panel;
 a gate driver applying scanning signals to a plurality of gate lines and a data driver applying video signals to a plurality of data lines in the display panel, the gate and data lines defining a plurality of pixels; and
 a thin film transistor in each pixel, the thin film transistor including a gate electrode, a gate insulating layer, a semiconductor layer, and source/drain electrodes, the gate insulating layer further having a first gate insulating layer and a second gate insulating layer, the second insulating layer including a material different from the first gate insulating layer, wherein at least one of the first and second gate insulating layers includes an organic/inorganic hybrid material,
 wherein the organic/inorganic hybrid material is a sol-gel compound of silicon alkoxide and metal alkoxide.

2. The display device of claim 1, wherein the organic/inorganic hybrid material has a dielectric constant and transmittance that change according to a content ratio of the silicon alkoxide and the metal alkoxide,
wherein the silicon alkoxide and the metal alkoxide are formed of at a ratio of 1 to 1.

3. The display device of claim 1, wherein an amount of the silicon alkoxide is substantially the same as an amount of the metal alkoxide in the organic/inorganic hybrid type material.

4. The display device of claim 1, wherein metal particles of the metal alkoxide includes at least any one of titanium Ti, zirconium Zr, yttrium Y, aluminum Al, hafnium Hf, calcium Ca, and magnesium Mg.

5. The display device of claim 1, wherein the metal alkoxide includes a material having a dielectric constant of about 7 or more.

6. The display device of claim 1, wherein one of the first and second gate insulating layers include an inorganic insulating material.

7. The display device of claim 6, wherein the inorganic insulating material is silicon nitride or silicon oxide.

8. The display device of claim 1, wherein the semiconductor layer includes amorphous silicon.

9. The display device of claim 8, wherein at least one of the first and second gate insulating layers includes an inorganic insulating material that is in contact with the semiconductor layer including amorphous silicon.

10. The display device of claim 1, wherein one of the first and second gate insulating layers includes an organic polymer material.

11. The display device of claim 10, wherein the organic polymer material includes at least any one of PVA (polyvinyl alcohol), PVAc (polyvinyl acetate), PVP (polyvinyl phenol) and PMMA (polyvinyl methyl methacrylate).

12. The display device of claim 1, wherein the semiconductor layer is formed of a pentacene-based or thiophene-based material.

13. The display device of claim 12, wherein the organic/inorganic hybrid material is in contact with the semiconductor layer including the pentacene-based or thiophene-based material.

14. The display device of claim 1, wherein a thickness of the first gate insulating layer is about 2000 Å and a thickness of the second gate insulating layer is about 2000 Å.

15. A thin film transistor (TFT) on a substrate, comprising:
a gate electrode;
a semiconductor layer insulated from the gate electrode and partially overlapped with the gate electrode;
first and second gate insulating layers between the gate electrode and the semiconductor layer, wherein the first gate insulating layer is formed of a material different from the second gate insulating layer and at least one of the first and second gate insulating layers includes a sol-compound of silicon alkoxide and metal alkoxide; and
source and drain electrodes at both sides of the semiconductor layer.

16. The TFT of claim 15, wherein metal particles of the metal alkoxide includes at least any one of titanium Ti, zirconium Zr, yttrium Y, aluminum Al, hafnium Hf, calcium Ca, and magnesium Mg.

17. The TFT of claim 15, wherein the metal alkoxide includes a material having a dielectric constant of about 7 or more.

18. The TFT of claim 15, wherein the other gate insulating layer not including the sol-compound between the first and second gate insulating layers is formed of an inorganic insulating material.

19. The TFT of claim 18, wherein the inorganic insulating material includes silicon nitride or silicon oxide.

20. The TFT of claim 18, wherein the semiconductor layer includes amorphous silicon.

21. The TFT of claim 15, wherein the other gate insulating layer not including the sol-compound between the first and second gate insulating layers is formed of an organic polymer material.

22. The TFT of claim 21, wherein the organic polymer material includes at least any one of PVA (polyvinyl alcohol), PVAc (polyvinyl acetate), PVP (polyvinyl phenol) and PMMA (polyvinyl methyl methacrylate).

23. The TFT of claim 21, wherein the semiconductor layer is formed of a pentacene-based or thiophene-based material.

24. The TFT of claim 15, wherein the sol-gel compound has a dielectric constant and transmittance that change according to a content ratio of silicon alkoxide and metal alkoxide,
wherein the silicon alkoxide and the metal alkoxide are formed of at a ratio of 1 to 1.

25. The TFT of claim 15, wherein the thin film transistor is a bottom-gate type or top-gate type thin film transistor.

* * * * *